United States Patent
Jensen et al.

(10) Patent No.: US 10,234,072 B2
(45) Date of Patent: Mar. 19, 2019

(54) VERTICAL INSTALLATION OF A SERVER MIDPLANE

(71) Applicant: Lenovo Enterprise Solutions (Singapore) Pte. Ltd., Singapore (SG)

(72) Inventors: David J. Jensen, Apex, NC (US); Brian Kerrigan, Cary, NC (US); Brian A. Trumbo, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 555 days.

(21) Appl. No.: 14/840,092

(22) Filed: Aug. 31, 2015

(65) Prior Publication Data

US 2017/0064857 A1    Mar. 2, 2017

(51) Int. Cl.
*H05K 7/14* (2006.01)
*F16M 13/02* (2006.01)

(52) U.S. Cl.
CPC ........... *F16M 13/02* (2013.01); *H05K 7/1487* (2013.01)

(58) Field of Classification Search
CPC .............................. F16M 13/02; H05K 7/1487
See application file for complete search history.

(56) References Cited

U.S. PATENT DOCUMENTS

| 5,412,534 A * | 5/1995 | Cutts .................... G11B 33/142 361/679.46 |
| 2009/0097200 A1 * | 4/2009 | Sharma .................... G06F 1/18 361/688 |

* cited by examiner

*Primary Examiner* — John C Hong
(74) *Attorney, Agent, or Firm* — Lieberman & Brandsdorfer, LLC (57) ABSTRACT

Embodiments of the invention relate to a system and method to enable and support vertical installation of a rack server midplane. The system is comprised of two primary components, including a guide and a bracket. The guide is secured to a server chassis, and is sized to receive the bracket. Upon receipt of the bracket, the bracket is held in position by the guide. The bracket is configured to frictionally hold the midplane in position. Installation of the bracket with the midplane within the chassis includes a direct installation of the bracket to the guide and an indirect installation of the midplane to the guide.

20 Claims, 6 Drawing Sheets

VERTICAL INSTALLATION OF A SERVER MIDPLANE

BACKGROUND

The present invention relates to a method of positioning a midplane in a rack server chassis, and associated framing apparatus. More specifically, the invention relates to a method and framing apparatus to install and align the midplane orthogonal to the chassis while maximizing available surface area of the midplane.

A backplane is an electronic circuit board containing circuitry and sockets into which additional electronic devices on other circuit boards of cards can be plugged. A midplane is a backplane constructed with slots on opposing sides. The midplane has the ability to plug cards into either side, and as such is often used in blade servers and telecommunications equipment. In the blade server implementation, one side of the midplane receives peripheral modules and the other side receives service modules. In telecommunications equipment, one side of the midplane accepts system processing cards and the other side accepts network interface cards.

SUMMARY

The invention includes an apparatus and method for installation of a server midplane.

In one aspect, the apparatus is directed to installation of a server midplane. First and second locating guides are secured to an interior chassis compartment. A bracket is installed in communication with the guides. More specifically, the bracket is comprised of three sections. A first section is installed in communication with the first guide and the third section is installed in communication with the second guide, with the first and second guides secured to oppositely positioned walls of the chassis interior. The midplane, when installed, is aligned with a second section of the bracket, with the second section extending across the chassis interior between the first and second guides.

In another aspect, a method is provided to install a server midplane within an interior compartment of a chassis. First and second guides are secured to the interior compartment, and more specifically, on oppositely positioned walls of the chassis interior. A bracket is installed within the compartment and in communication with the guides. The installation includes placing a first section of the bracket in communication with the first guide and a third section of the bracket in communication with the second guide. The midplane is attached to the bracket, including an alignment of the midplane with a second section of the bracket that extends between the first and third bracket sections.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

A rack server, also called a rack-mounted server, is a computer dedicated to use as a server and designed to be installed in a framework called a rack. The rack contains multiple mounting slots called bays, each designed to hold a hardware unit secured in place with an attachment device, such as a screw. The rack server has a low-profile enclosure, in contrast to a tower server, which is built into an upright cabinet. In one embodiment, the slot may be configured to receive a blade server.

Figure 1:
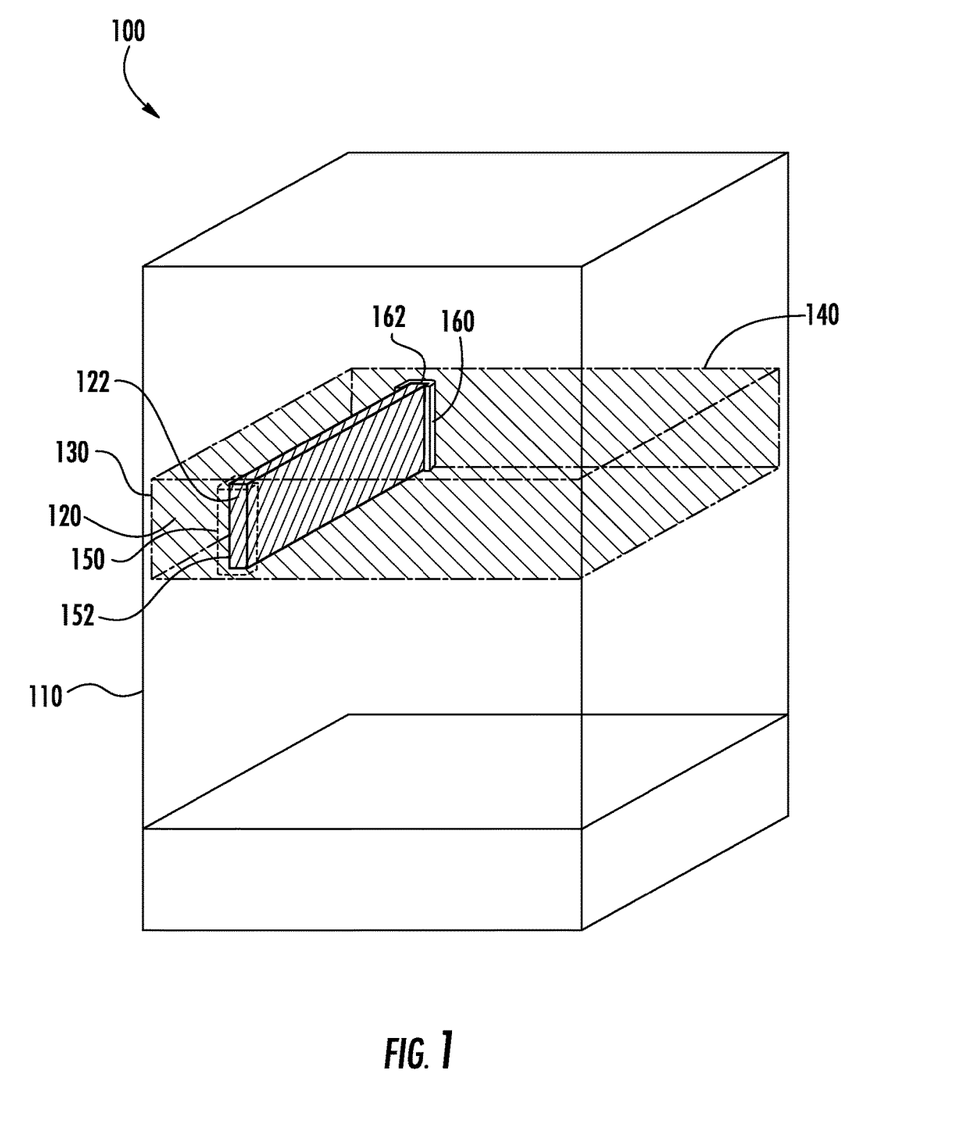
FIG. 1 depicts a block diagram illustrating a rack with a mounted rack server.

A single rack can contain multiple servers stacked one above the other, consolidating network resources and minimizing the required footprint. Referring to FIG. 1, a block diagram (100) is provided illustrating a rack (110) with a mounted rack server. As shown herein, the rack server is constrained by the width of the rack. In one embodiment, the width is limited to 450 mm. Due to the width constraints, there is a trade-off between space utilized by electronics versus space used for mechanical structure. With the primary function of the server being one of electronics, the space for the electronics within the server is at a premium and increasing efforts are made to provide for a more compact mechanical packaging. The standard of measure for designating vertical user space in the rack is known as rack unit (RU or U). This unit of measurement refers to the height of equipment installed between the space between shelves on the rack. In a standard size, the 1U measurement is equal to 1.75 inches. For example, a rack designated as 20U has twenty rack spaces for equipment and has 35 inches of vertical usable space. Accordingly, in a standard size rack and associated equipment, the unit of measure of the equipment height is the U, although other sizes may be used for other purposes.

As shown in FIG. 1, a server (120) is mounted into a 2U opening in the rack (110). The server (120) is shown with a vertically installed midplane (122). More specifically, the midplane (122) is shown installed orthogonal to a plug direction of devices to the front and rear (130) and (140) of the server (120), respectively.

There are two primary components that support the orthogonal installation of the midplane, including: a guide and a bracket. The guide functions to both direct the midplane into place and, once secured to the guide, to hold the bracket in position. The bracket functions to maintain precise alignment of the midplane once assembled in the rack mount server. In one embodiment, the midplane is held in place by the set of guides and brackets without utilizing or otherwise interfering with real estate on the midplane, thereby enabling the midplane to accommodate additional electronic devices.

Figure 2:
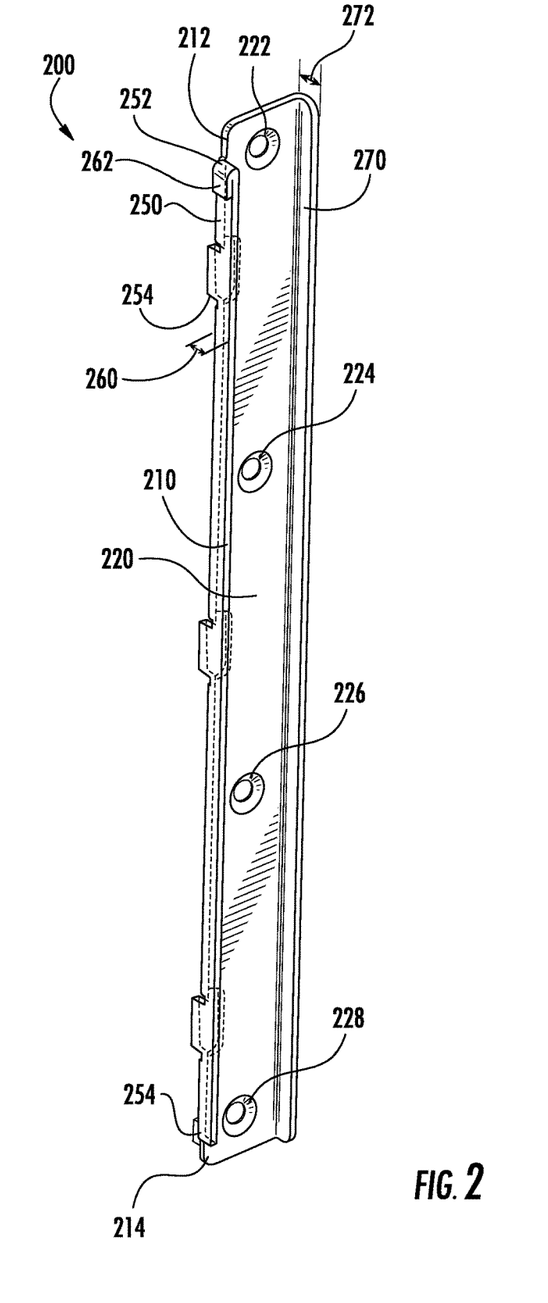
FIG. 2 depicts a perspective view of a guide shown from the front side.

Referring to FIG. 2, a perspective view (200) of a guide (210) is shown from the front side. The guide (210) is has an elongated profile with a proximal end (212) and a distal end (214). The guide (210) is shown with two elongated walls (220) and (250), referred to herein as a first wall (220) and a second wall (250). Four openings (222), (224), (226), and (228) are shown positioned in the first wall (220). The openings (222), (224), (226), and (228) are spaced along the elongated profile of the first wall (220). More specifically, the openings (222), (224), (226), and (228) are each sized to receive a connection element (not shown) to secure the guide (210) to the chassis of a server or alternative rack mounted hardware installed in the rack, such as the rack shown and described in FIG. 1. In one embodiment, the guide (210) is provided as an integrated component to the chassis of the rack mounted hardware. Accordingly, the guide (210), whether integrated or installed, functions as an interface between the chassis and a received bracket.

The second wall (250) is positioned perpendicular to the first wall (220), and extends vertically. As shown, the second wall (250) includes a proximal end (252) and a distal end (254). The proximal end (252) is shown positioned adjacent to the opening (222) of the first wall (220), and the distal end (254) is shown positioned adjacent to opening (228) of the first wall (220). The second wall (250) is configured to receive the bracket, shown and described in FIG. 3. The second wall (250) has a width (260) that is relatively uniform from the proximal end (252) to the distal end (254). A portion of the second wall (250) has an increased thickness (262) adjacent to the proximal end (252). This increased thickness (262) of the second wall is configured to be received by the bracket.

The guide (210) is shown with a third wall (270) that extends the length of the guide from the proximal end (212) to the distal end (214). The third wall (270) is shown orthogonal to the first wall (220) and parallel to the second wall (250). The depth (272) of the third wall (270) is relatively shallow. In one embodiment, the depth (272) is congruent with the depth of the midplane to be received by the bracket. The third wall (270) functions to prevent or otherwise mitigate direct contact between the chassis and the midplane.

Referring back to FIG. 1, two guides are installed in communication with the chassis, with a first guide (150) installed in communication with a first wall (152), and a second guide (160) installed in communication with a second wall (162), with the first and second walls (152) and (162), respectively, positioned on opposite sides of the chassis. Each of the guides (150) and (160) are configured as shown and described in FIG. 2. In one embodiment, the first guide (150) and the second guide (160) have reflective properties, so that the increased thickness (262) of the distal end (254) of the second guide (160) is positioned opposite to the increased thickness (262) of the proximal end (252).

Figure 3:
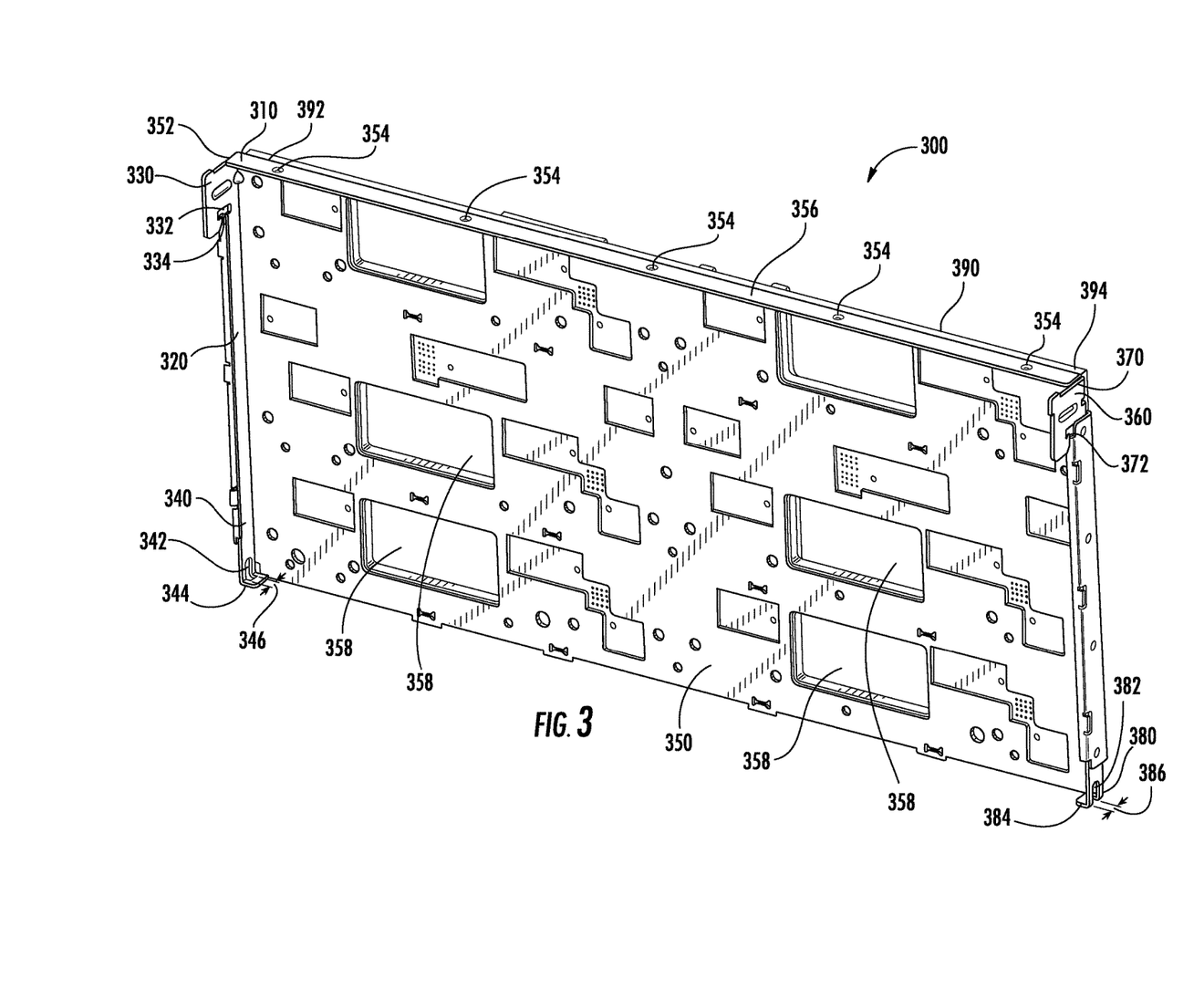
FIG. 3 depicts a perspective view of an alignment bracket.

Referring to FIG. 3, a perspective view (300) of an alignment bracket (310), also referred to herein as a bracket, is shown and described. The bracket (310) is shown with three sections (320), (350), and (360). The first and third sections (320) and (360) are oppositely positioned, and are both orthogonal to the second section (350). The first section (320) is elongated with a proximal end (330) and a distal end (340). The proximal end (330) is positioned in communication with the second section (350) at (352). The proximal end (330) is configured with an opening (332) sized to receive the proximal end of the guide at (262). More specifically, the increase thickness of the guide shown in FIG. 2 at (262) is sized to be received and held in place via friction at the opening (332). As shown, the opening (332) is narrow at (334) with an increase in the size of the opening at (332). The varied size of the opening enables the guide (as shown at (262) in FIG. 2) to be held in communication with the opening with the narrowing of the opening at (334) to prevent the guide from becoming dislodged. The distal end (340) of the first section (320) is configured with an opening (342) sized to receive a securing element (not shown) in communication with the chassis. More specifically, the opening (342) secures the bracket (310) directly to the chassis.

As further shown, the first section includes a shallow wall (344) positioned opposite and relatively perpendicular to the second section (350). In one embodiment, the wall (344) is also referred to herein as a tab. The opening (342) is shown extending into the wall (344). In one embodiment, the width of the opening (346) in the wall (344) is sized to receive the securing element in communication with the chassis, so that the bracket may effectively slide over the securing element. The tab (344) functions to anchor the first section (310) of the bracket with respect to the chassis at the first guide. In one embodiment, the tab (344) is configured with a narrow profile to mitigate interference. The first section (320) of the bracket (310) is configured to extend the height of the chassis.

The third section (360) is similarly configured to the first section (320). As shown, the third section is positioned opposite the first section (320). The third section (360) is elongated with a proximal end (370) and a distal end (380). The proximal end (370) is configured with an opening (372) sized to receive the proximal end of the guide at (262). More specifically, the increase thickness of the guide at (262) is sized to be received and held in place via friction at the opening (372). The distal end (380) of the third section (360) is configured with an opening (382) sized to receive a securing element (not shown) in communication with the chassis. More specifically, the opening (382) attaches the bracket (310) directly to the chassis on a wall oppositely positioned from the first section (320). As such, the opening (372) is positioned opposite opening (332), and opening (382) is positioned opposite opening (342).

As further shown, the third section includes a shallow wall (384) positioned opposite and relatively parallel to the second section (350). In one embodiment, the wall (384) is also referred to herein as a tab. The opening (382) is shown extending into the wall (384). In one embodiment, the width of the opening (386) in the wall (384) is sized to receive a securing element in communication with the chassis, so that the bracket may effectively slide over the securing element. The tab (384) functions to anchor the bracket (310) with respect to the chassis. In one embodiment, the tab (384) is configured with a narrow profile to mitigate interference.

The second section (350) of the bracket (310) is configured to extend along the height of the chassis of both the first and third sections (320) and (360) respectively. As shown in FIG. 3, the bracket (310) is secured to opposite walls of the chassis, and orthogonal to the front of the chassis when positioned in the rack. A circuit board (390) is shown positioned with respect to the bracket (310). As shown, the circuit board (390) is shown with a proximal end (392) in communication with the first section (320) of the bracket (310), a distal end (394) in communication with the third section (360), and a medial top wall (356) in communication with the second section (350). As shown, the second section (350) has a plurality of dimples (354) spaced along the length of the top wall (356) of the second section (350). Each dimple (354) functions to fittingly (e.g. frictionally) receive the circuit board (390) without the use of extraneous connecting elements that may cause electronic interference. The circuit board (390) is also referred to herein as a midplane. The bracket (310) functions to connect the midplane (390) to the chassis from the front (130) to the rear (140). More specifically, the bracket (310) provides two functions including guiding the midplane (390) into place within the chassis, and alignment of the midplane (390) once assembled.

The midplane (390) may receive electronics on both sides of the board. More specifically, the second section (350) is shown herein as a wall positioned to extend from the first section (320) to the third section (360), with the wall positioned orthogonal to the positioning of the chassis. The second section (350) is configured with a plurality of openings (358). In the example shown herein, the quantity of openings (358) should not be considered limiting. In one embodiment, additional openings may be provided. Similarly, in one embodiment, fewer openings may be provided. The openings (358) are positioned to receive one or more electronic subassemblies. One side of the midplane (390) is in communication with the bracket (310), and specifically the second section (350). The openings (358) are sized and positioned to enable each electronic subassembly to connect to the surface of the midplane (390) that is in communication with the bracket (310). At the same time, the opposite side of the midplane (390) is not restricted from receipt of the electronic subassembly by the position of the bracket (310). Accordingly, the midplane (390), with the support of the bracket (310), may receive one or more electronic subassemblies on both opposing sides.

Figure 4:
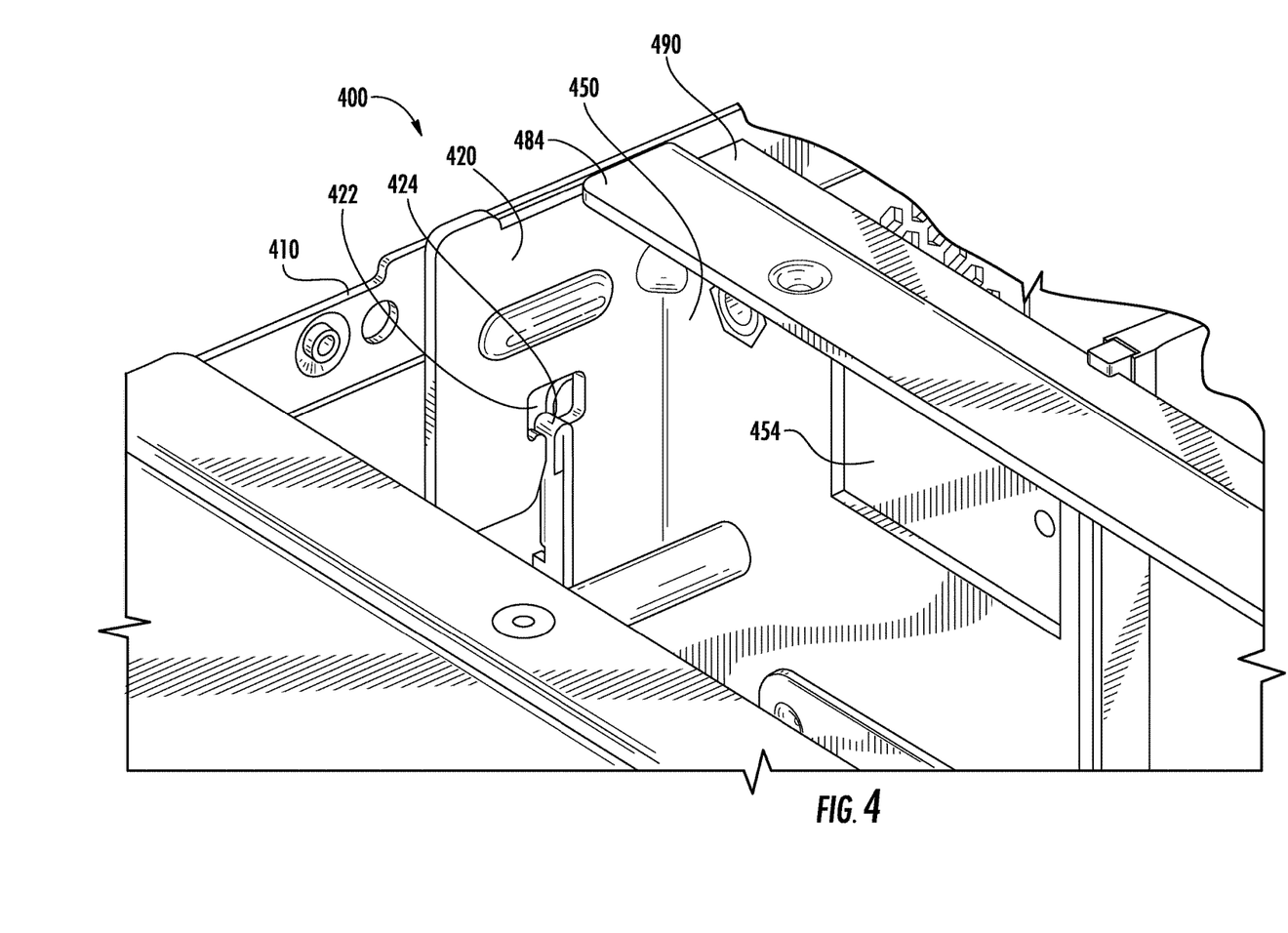
FIG. 4 depicts a perspective view of a top portion of the bracket.

Referring to FIG. 4, a perspective view (400) of a top portion of the bracket is provided. More specifically, the view (400) shows a top portion of the first section (420) and second section (450), with the second section showing a top wall (484) thereof. The first section (420) is shown with an opening (422) secured to the chassis (410) via the guide (424). The first section (420) is secured to the chassis (410) and the second section (450). In addition, a top portion of the second section (450) is shown with wall (484) positioned both in communication with the first section (420) and orthogonal to the first section (and the chassis (410). As further shown herein, the second section (450) has an opening (454), sized and configured to receive an electronic sub-assembly (not shown). A midplane (490) is shown in communication with the second section (450).

Figure 5:
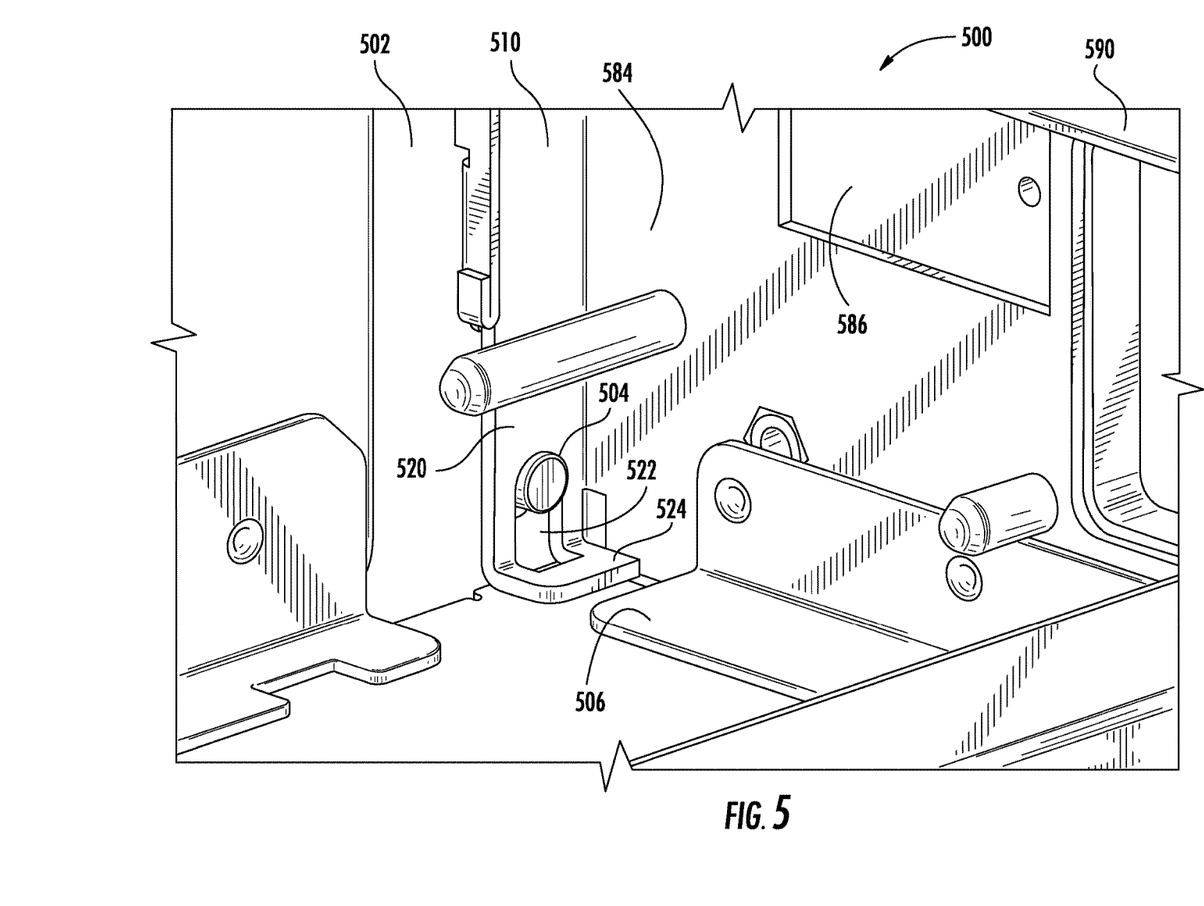
FIG. 5 depicts a perspective view of a bottom portion of the bracket.

Referring to FIG. 5, a perspective view (500) of a bottom portion of the bracket is provided. More specifically, the view (500) shows a bottom portion of the first section (520) and wall (584). The first section (520) is secured to the chassis via the opening (522). As shown and described in FIG. 3, the opening (522) is elongated and together with the tab (524) and the extension of the opening (522) in the tab (524), and the opening (522) functions as a slot to slidingly receive the securing element (504) of the chassis (502). In addition, the tab (524) is shown as a shallow wall perpendicular to both the first section (520) and the wall (584). The tab (524) is configured and positioned to anchor the bracket (510) while mitigating interference with any internal components or structure of the chassis (502), such as (506). Furthermore, as shown herein, the wall (584) is provided with an opening (586). In one embodiment, the opening enables a midplane positioned on an opposite side of the wall (584) to receive an electronic subassembly on both the side of the midplane in communication with the bracket (510) and an opposite side of the midplane (590). In other words, the bracket and guide assembly firmly fixes the midplane within the chassis without pins or other structure for support. Additionally, with the support of the guides and bracket, the openings (586) allow receipt of peripheral components on oppositely disposed surfaces of the midplane. Accordingly, the bracket (510) is configured to enable both sides of the midplane to receive electronic subassemblies, thereby maximizing the available surface area of the midplane.

The server described above in FIG. 1 has been labeled with tools in the form of a guide and a bracket. The tools function to position and align a midplane orthogonal to the chassis of a rack mount server. More specifically, the configuration of the tools mitigates electronic interference while maximizing the surface area of the midplane for receipt of one or more electronic sub-assemblies.

Figure 6:
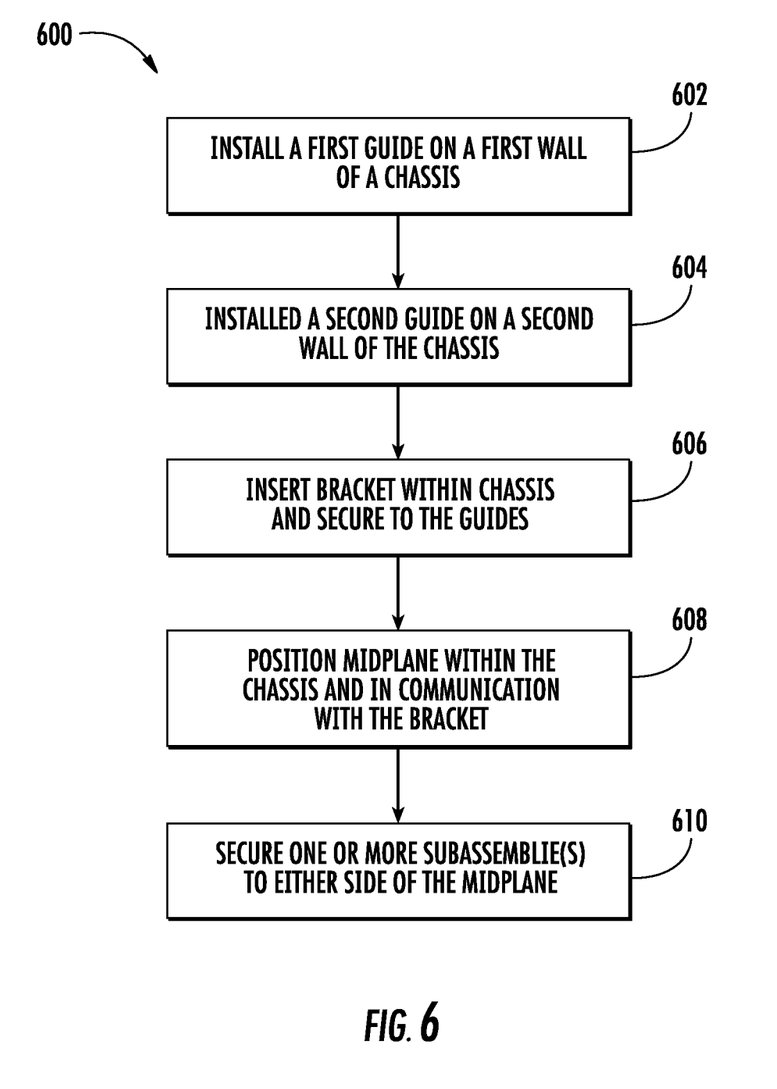
FIG. 6 depicts a flow chart illustrating a process for installing the midplane orthogonal to the front and rear position of the rack mount server.

Referring to FIG. 6, a flow chart (600) is provided illustrating a process for installation of the midplane orthogonal to the front and rear position of the rack mount server. First, a set of guides is installed within the chassis. More specifically, a first guide is installed on a first wall of the chassis (602), and a second guide is installed on a second wall of the chassis (604). The first and second walls are positioned on opposite sides of the chassis. In one embodiment, the first wall is the front wall and the second wall is the rear wall. Following installation of the guides, a bracket is inserted within the chassis and secured to the guides (606). The installation includes securing the first section of the bracket to the first guide, including a slot tab of the first bracket received by a securing element of the chassis and an opening in the proximal end of the first section received by the first guide. In addition, the installation includes a third section of the bracket secured to the second guide in a similar manner as employed in securing the first section to the first guide. In one embodiment, the process of installing the first and third section of the bracket to the respective guides takes place concurrently.

Once the bracket is installed, a midplane is positioned within the chassis and in communication with the inserted and secured bracket (608). More specifically, the circuit board is positioned between first and third sections of the bracket, and fittingly received by a top wall of a second section of the bracket disposed between the first and third sections.

The attachment of the circuit board to the bracket is referred to herein as a subassembly. The midplane may be secured to the bracket prior to installation in the chassis. In one embodiment, the midplane may be secured to the bracket following installation of the bracket in the chassis.

Similarly, as shown in FIG. 5, the wall of the bracket is aligned with the midplane. Following installation of the midplane in the chassis, one or more electronic subassemblies may be secured to either side of the midplane (610).

As shown herein, the placement and position of the guides and the first and third sections is symmetric. The first guide is positioned in communication with a first wall of the chassis, and the second guide is symmetrically positioned on an oppositely positioned wall of the chassis. As such, the first and second guides are mirror image configurations. Similarly, the first and third sections of the bracket are received by the first and third guides, respectively. The first and third sections are symmetrically positioned with oppositely positioned walls of the chassis, and as such have mirror image configurations.

The described features, structures, or characteristics may be combined in any suitable manner in one or more embodiments. In the descriptions, numerous specific details are provided, such as examples of guides and a bracket, to provide a thorough understanding of embodiments. One skilled in the relevant art will recognize, however, that the alignment of the midplane orthogonal to the front and rear of the rack mount hardware element can be practiced without one or more of the specific details, or with other methods, components, materials, etc. In other instances, well-known structures, materials, or operations are not shown or described in detail to avoid obscuring aspects.

Aspects of the present invention are described in FIG. 6 with reference to a flowchart illustration and block diagrams of apparatus (systems) in FIGS. 1-5 according to the embodiments. The flowchart and block diagrams in the Figures illustrate the architecture, functionality, and operation of possible implementations of systems and methods according to various embodiments of the present invention. In this regard, each block in the flowchart or block diagrams may represent a module, segment, or portion of the orthogonal installation of the midplane. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed.

Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. The implementation of guides and bracket support the orthogonal positioning and installation of the midplane in a manner that maximizes surface area on the midplane for receipt of electronic subassemblies while mitigating (electromagnetic) interference.

It will be appreciated that, although specific embodiments of the invention have been described herein for purposes of illustration, various modifications may be made without departing from the spirit and scope of the invention. In particular, as shown and described herein the openings in the bracket coincide with connectors on the midplane. In one embodiment, one or more openings may be provided in the bracket to coincide with openings in the midplane, with the opening alignments to provide for airflow to cool subassemblies. Similarly, in one embodiment, the midplane may be installed after the chassis has been assembled. Accordingly, the scope of protection of this invention is limited only by the following claims and their equivalents.

We claim:

1. An apparatus comprising:
   first and second locating guides secured to an interior chassis compartment;
   a bracket installed within the compartment, including a first section of the bracket in communication with the first guide and a third section of the bracket in communication with the second guide, the first and second guides on oppositely positioned walls of the interior chassis compartment; and
   a midplane received by and attached to the bracket, the received midplane aligned and in communication with a second section of the bracket extending between the first and third sections within the chassis.

2. The apparatus of claim 1, wherein the received midplane is aligned relatively orthogonal to the chassis.

3. The apparatus of claim 1, further comprising the first guide configured with a body having a proximal end and an oppositely positioned distal end, and the first section of the bracket configured with a first proximal end and an oppositely disposed first distal end, and the first section of the bracket aligned with the first guide, including the first proximal end of the first section of the bracket positioned in communication with the proximal end of the first guide and the first distal end of the first section of the bracket positioned in communication with the distal end of the first guide to secure the first section of the bracket to the first guide.

4. The apparatus of claim 3, further comprising a tab positioned adjacent to the distal end of the first section of the bracket, the tab to anchor the first section of the bracket to the chassis.

5. The apparatus of claim 3, further comprising the distal end of the first section of the bracket configured with an opening extending into the tab to slidingly receive a securing element.

6. The apparatus of claim 3, further comprising a slot positioned adjacent to the proximal end of the first section of the bracket, the slot in sliding receipt of a proximal end of the first guide.

7. The apparatus of claim 6, wherein the proximal end of the first guide has a thickness sized to frictionally hold the proximal end of the first section of the bracket.

8. The apparatus of claim 1, further comprising the second bracket section orthogonal to the first and third sections, the first section in communication with the first guide secured to the interior of the chassis and the third section in communication with a second guide secured to the chassis on a wall positioned opposite to the first guide.

9. The apparatus of claim 8, further comprising the received midplane secured to the second section extending from the first section to the third section with one or more dimples positioned along a top wall of the second section to frictionally hold the received midplane in position relative to the chassis.

10. The apparatus of claim 1, wherein the first guide is integrated into the chassis.

11. An apparatus comprising:
a first locating guide secured to a first wall of an interior chassis compartment;
a bracket installed in communication with the first guide, the bracket having a first section received by the first guide and a third section positioned in communication with a second guide secured to a second wall of the chassis, with the second wall being relatively parallel to the first wall, and a second section extending across the chassis from the first section to the third section, the second section positioned relatively orthogonal to the chassis; and
a midplane installed relatively parallel to and in communication with the second section of the bracket, wherein the received midplane is relatively orthogonal to the chassis.

12. The apparatus of claim 11, further comprising the first section of the bracket secured to the first guide, including a first proximal end of the first section of the bracket slidingly received by a proximal end of the first guide and the first distal end of the first section of the bracket slidingly positioned in communication with a distal end of the first guide.

13. The apparatus of claim 12, further comprising an anchor adjacent to the first distal end of the first section of the bracket, the anchor relatively perpendicular to the first section of the bracket and to hold the first section of the bracket positioned to an interior wall of the chassis.

14. The apparatus of claim 13, further comprising the second section of the bracket having a bracket tab extending from the first section to the third section, the bracket tab being relatively parallel to the anchor when the bracket is positioned in communication with the first and second guides.

15. The apparatus of claim 14, further comprising the second section of the bracket having a bracket wall positioned relatively orthogonal to the chassis, and the received midplane attached to and relatively parallel to the bracket wall.

16. The apparatus of claim 15, further comprising the bracket wall having an opening aligned with a connector of the received midplane, wherein the opening allows the received midplane to receive peripheral components on oppositely disposed surfaces of the received midplane, including at least one peripheral component to extend through the opening.

17. The apparatus of claim 11, further comprising the second section of the bracket having an indent to frictionally hold the received midplane in alignment with the third section of the bracket and orthogonal to the first and second sections of the bracket.

18. A method comprising:
securing first and second locating guides to an interior chassis compartment;
installing a bracket within the compartment, including a first section of the bracket in communication with the first guide and a third section of the bracket in communication with the second guide, the first and second guides on oppositely positioned walls of the interior chassis compartment; and
attaching a midplane to the bracket, wherein the received midplane is aligned and in communication with a second section of the bracket extending between the first and third sections within the chassis.

19. The method of claim 18, further comprising positioning an anchor adjacent to a first distal end of the first section of the bracket, the anchor relatively perpendicular to the first section of the bracket and holding the first section of the bracket positioned to an interior wall of the chassis.

20. The method of claim 18, further comprising configuring the bracket with a wall extending across the second section, the wall having an opening aligning with a connector of the received midplane, wherein the opening allows the received midplane to receive peripheral components on oppositely disposed surfaces of the received midplane, including at least one peripheral component to extend through the opening.

* * * * *